(12) United States Patent
Oka

(10) Patent No.: US 11,939,472 B2
(45) Date of Patent: Mar. 26, 2024

(54) CURABLE SILICONE COMPOSITION, ENCAPSULANT AND OPTICAL SEMICONDUCTOR DEVICE

(71) Applicant: DuPont Toray Specialty Materials Kabushiki Kaisha, Tokyo (JP)

(72) Inventor: Yutaka Oka, Chiba (JP)

(73) Assignee: Dupont Toray Specialty Materials Kabushiki Kaisha, Tokyo (JP)

(*) Notice: Subject to any disclaimer, the term of this patent is extended or adjusted under 35 U.S.C. 154(b) by 0 days.

(21) Appl. No.: 17/663,604

(22) Filed: May 16, 2022

(65) Prior Publication Data

US 2022/0372291 A1 Nov. 24, 2022

(30) Foreign Application Priority Data

May 19, 2021 (JP) ................. 2021-084621

(51) Int. Cl.
*C08L 83/04* (2006.01)
(52) U.S. Cl.
CPC .......... *C08L 83/04* (2013.01); *C08L 2203/20* (2013.01); *C08L 2205/025* (2013.01)
(58) Field of Classification Search
CPC ............. C08L 83/04; C08L 2203/20; C08L 2203/206; C08L 2205/03
See application file for complete search history.

(56) References Cited

U.S. PATENT DOCUMENTS 9,683,084 B2 * 6/2017 Kobayashi ............ H01L 33/56
2018/0057652 A1 * 3/2018 Irie ....................... C08J 9/0061

FOREIGN PATENT DOCUMENTS

| JP | H1-299873 A | 12/1989 |
| JP | H01299873 A | 12/1989 |
| JP | H6-192576 A | 7/1994 |
| JP | H06192576 A | 7/1994 |
| JP | 2010-163554 A | 7/2010 |
| JP | 2010163554 A | 7/2010 |
| NO | 2018/180704 A1 | 10/2018 |
| WO | 2018/079215 A1 | 5/2018 |
| WO | 2018079215 A1 | 5/2018 |
| WO | 2018180704 A1 | 10/2018 |

* cited by examiner

*Primary Examiner* — Ling Siu Choi
*Assistant Examiner* — Olga Lucia Donahue
(74) *Attorney, Agent, or Firm* — Lorenz & Kopf, LLP

(57) ABSTRACT

A Curable Silicone Composition, Encapsulant And Optical Semiconductor Device provides a curable silicone composition having excellent storage stability at room temperature. A curable silicone composition having (A) a resinous alkenyl group-containing organopolysiloxane including at least two alkenyl groups per molecule and at least one siloxane unit represented by $SiO_{4/2}$; (B) an organohydrogenpolysiloxane having at least two silicon atom-bonded hydrogen atoms in one molecule; (C) an alkyne group-containing compound; and (D) a curing catalyst, wherein the content of the resinous alkenyl group-containing organopolysiloxane (A) is 20 mass % or more based on the total mass of the organopolysiloxane components.

18 Claims, No Drawings

CURABLE SILICONE COMPOSITION, ENCAPSULANT AND OPTICAL SEMICONDUCTOR DEVICE

CROSS-REFERENCE TO RELATED APPLICATIONS

This application claims priority pursuant to 35 U.S.C. 119(a) to Japan Patent Application No. 2021-084621, filed May 19, 2021, which application is incorporated herein by reference in its entirety.

TECHNICAL FIELD

The present invention relates to a curable silicone composition, and more specifically relates to a curable silicone composition that is suitable for use in encapsulants for optical semiconductors. The present invention also relates to an encapsulant comprising such a curable silicone composition, and an optical semiconductor device sealed with a cured product of said encapsulant.

BACKGROUND ART

When curable silicone compositions are cured, they form cured products having excellent heat resistance, cold resistance, electrical insulation properties, weather resistance, water repellency, and transparency, and so they are used in a wide range of industrial fields. In particular, as compared to other organic materials, these cured products are less prone to discoloration and their physical properties such as durability deteriorate less, and so they are used for optical materials, and in particular are widely used as silicone sealing materials used in optical semiconductor devices such as light-emitting diodes (LEDs).

In particular, a curable organopolysiloxane composition which cures by means of a hydrosilylation reaction is used as a protective coating, encapsulant, etc., for optical semiconductor elements in optical semiconductor devices such as photocouplers, light-emitting diodes and solid-state imaging elements. Since optical semiconductor elements emit or receive light, it is essential that the protective coating or encapsulant for the optical semiconductor element does not to absorb or scatter light.

In regard to the curing type of the curable silicone composition, a widely used type is an addition curing type which contains an organohydrogenpolysiloxane having a hydrogen atom bonded to a silicon atom (SiH group) and an organopolysiloxane having an alkenyl group bonded to a silicon atom (e.g., vinyl group), where an addition reaction of the SiH group, etc. onto the vinyl group (hydrosilylation) is used. Since a curing reaction proceeds even at room temperature in the addition curing-type silicone composition, curable silicone compositions with excellent storage stability at room temperature have been proposed.

For example, patent document 1 describes an addition curing-type silicone composition comprising: (A) an organopolysiloxane having at least two unsaturated aliphatic hydrocarbon groups in one molecule; (B) an organohydrogenpolysiloxane in an amount that provides a value of 0.5-5 for the ratio of the number of SiH groups to the total number of unsaturated aliphatic hydrocarbon groups in the component (A); and (C) an effective amount of hydrosilylation catalyst microparticles that have a microcapsule structure containing a platinum-group metal catalyst-containing organic compound or polymer compound as a core material and a three-dimensional crosslinked polymer compound obtained by polymerizing at least one polyfunctional monomer as a wall material, the platinum-group metal catalyst-containing organic compound or polymer compound having a dynamic viscosity of 10-100,000 $mm^2/s$ at 25° C.

In addition, patent document 2 describes a one-pack organopolysiloxane composition, which is an addition curing-type composition comprising: an alkenyl group-containing organopolysiloxane; an organohydrogenpolysiloxane having a hydrogen atom bonded to a silicon atom; a curing catalyst; an amine-based compound; and an inorganic filler, wherein β-diketone or β-ketoester is blended.

In addition, patent document 3 describes a one-pack curing-type thermally conductive silicone grease composition which comprises at least: (A) 100 parts by mass of an organopolysiloxane having at least one unsaturated aliphatic hydrocarbon group bonded to a silicon atom in one molecule and having a viscosity at 25° C. of 50-100,000 mPa·s; (B) 0.1 to 50 parts by mass of an organohydrogensiloxane containing at least two silicon-atom-bonded hydrogen atoms in one molecule; (C) 400 to 5000 parts by mass of a thermally conductive filler having an average particle diameter of 0.01 to 200 μm; (D) 0.01 to 20 parts by mass of a fine particle catalyst with an average particle diameter of 0.01 to 10 μm, which comprises a thermoplastic resin containing a platinum-based catalyst in an amount of 0.01 mass % or more in terms of the amount of platinum-metal atoms and having a softening point of 40° C. to 200° C.; and (E) 0.001 to 5 parts by mass of a curing control agent, the silicone grease composition having a complex elastic modulus at 25° C. of 0.01-20 MPa after curing.

Furthermore, patent document 4 describes an organopolysiloxane composition comprising: (A) 100 parts by weight of an organopolysiloxane having at least two silicon atom-bonded alkenyl groups in one molecule; (B) 1 to 100 parts by weight of finely particulate silica; (C) 0.00001 to 1 part by weight of a platinum alkenyl siloxane complex; and (D) 0.00001 to 5 parts by weight of an organopolysiloxane having a specific bond and 8 or fewer silicon atoms in one molecule.

In addition, patent document 5 describes a transparent one-component type curable composition comprising: (A) an organic polymer having a silicon-containing group cross-linkable by forming a siloxane bond; (B) dry hydrophilic silica; (C) (c-1) carboxylic acid and/or (c-2) a metal salt of carboxylic acid; and (D) an amine compound.

However, conventional curable silicone compositions still have the problem of inadequate storage stability at room temperature.

PRIOR ART DOCUMENTS

Patent Documents

[Patent Document 1] WO 2018/180704 A1
[Patent Document 2] JP H6-192576 A
[Patent Document 3] WO 2018/079215 A1
[Patent Document 4] JP H1-299873 A
[Patent Document 5] JP 2010-163554 A

SUMMARY OF THE INVENTION

Problems to be Solved by the Invention

An objective of the present invention is to provide a curable silicone composition having excellent storage stability at room temperature while still maintaining thermal curing properties.

Another objective of the present invention is to provide an encapsulant including the curable silicone composition of the present invention. Yet another objective of the present invention is to provide an optical semiconductor device that is sealed with a cured product of the encapsulant of the present invention.

Means for Solving the Problems

In order to solve the abovementioned problems, the present inventors carried out extensive studies, and as a result, surprisingly, they found that a curable silicone composition containing the following may be stored at room temperature for a long period of time and has an excellent storage stability, the curable silicone composition comprising: (A) a resinous alkenyl group-containing organopolysiloxane including at least two alkenyl groups per molecule and at least one siloxane unit represented by $SiO_{4/2}$, in an amount of 20 mass % or more based on the total mass of the organopolysiloxane components; (B) an organohydrogenpolysiloxane having at least two silicon atom-bonded hydrogen atoms in one molecule; (C) an alkyne group-containing compound; and (D) a curing catalyst, and hence they arrived at the present invention.

Accordingly, the present invention relates to:

a curable silicone composition comprising: (A) a resinous alkenyl group-containing organopolysiloxane including at least two alkenyl groups per molecule and at least one siloxane unit represented by $SiO_{4/2}$; (B) an organohydrogenpolysiloxane having at least two silicon atom-bonded hydrogen atoms in one molecule; (C) an alkyne group-containing compound; and (D) a curing catalyst, wherein the content of the resinous alkenyl group-containing organopolysiloxane (A) is 20 mass % or more based on the total mass of the organopolysiloxane components.

The curable silicone composition preferably further includes a linear alkenyl group-containing organopolysiloxane.

The curable silicone composition preferably includes at least two types of linear alkenyl group-containing organopolysiloxane.

The organohydrogenpolysiloxane (B) is preferably a linear organohydrogenpolysiloxane having silicon atom-bonded hydrogen atoms on the side chain.

The alkyne group-containing compound (C) is preferably an alkyne group-containing silane.

The curing catalyst (D) is a platinum-based catalyst and preferably includes from 0.01 ppm to 10 ppm of platinum atoms with respect to the total mass of the curable silicone composition.

The molar ratio (H/Vi) of the alkenyl groups and hydrogen atoms derived from the organopolysiloxane components is preferably from 0.8 to 3.0.

The present invention also relates to an encapsulant comprising the curable silicone composition according to the present invention.

The present invention also relates to an optical semiconductor device that is equipped with a cured product of the encapsulant according to the present invention.

Effects of the Invention

By virtue of the curable silicone composition according to the present invention, a thermally curable silicone composition with excellent storage stability at room temperature can be provided.

MODE FOR CARRYING OUT THE INVENTION

Curable Silicone Composition

The curable silicone composition according to the present invention comprises at least:

(A) a resinous alkenyl group-containing organopolysiloxane including at least two alkenyl groups per molecule and at least one siloxane unit represented by $SiO_{4/2}$; (B) an organohydrogenpolysiloxane having at least two silicon atom-bonded hydrogen atoms in one molecule; (C) an alkyne group-containing compound; and (D) a curing catalyst, wherein the content of the resinous alkenyl group-containing organopolysiloxane (A) is 20 mass % or more based on the total mass of the organopolysiloxane components.

The components of the curable silicone composition of the present invention will be described in detail below.

(A) Resinous alkenyl group-containing organopolysiloxane including at least two alkenyl groups per molecule and at least one siloxane unit represented by $SiO_{4/2}$ The component (A) is a resinous alkenyl group-containing organopolysiloxane including at least two alkenyl groups per molecule and at least one siloxane unit represented by $SiO_{4/2}$. The curable silicone composition according to the present invention may comprise one type of the resinous alkenyl group-containing organopolysiloxane of component (A) or may comprise two or more types of the resinous alkenyl group-containing organopolysiloxane of component (A).

The molecular structure of the component (A) is a resinous form. In the present specification, the term "resinous" means that there is a branched structure or a 3D network structure in the molecular structure. Specifically, the resinous alkenyl group-containing organopolysiloxane of component (A) contains at least one siloxane unit represented by $SiO_{4/2}$.

Examples of the alkenyl group which may be included in component (A) include C2-12 alkenyl groups such as vinyl, allyl, butenyl, pentenyl, hexenyl, heptenyl, octenyl, nonenyl, decenyl, undecenyl, and dodecenyl groups, and vinyl groups are preferred.

Examples of the organic group bonded to the silicon atom other than alkenyl groups included in the component (A) include optionally halogen-substituted monovalent hydrocarbon groups other than alkenyl groups, for example: C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C7-20 aralkyl groups such as benzyl, phenethyl and phenylpropyl groups; C6-20 aryl groups such as phenyl, tolyl, xylyl and naphthyl groups; and any of these groups in which some or all of the hydrogen atoms are substituted with halogen atoms such as fluorine, chlorine, and bromine atoms. It should be noted that the silicon atoms in component (A) may have a small quantity of hydroxyl groups or an alkoxy group such as a methoxy group or ethoxy group within a range that does not hinder the objectives of the present invention. The group that bonds to the silicon atom other than the alkenyl group in component (A) is preferably a C1-6 alkyl group, particularly a methyl group.

DETAILED DESCRIPTION

According to an embodiment of the present invention, the component (A) may preferably be represented by the following average unit formula (I):

$(R^1_3SiO_{1/2})_a(R^1_2SiO_{2/2})_b(R^1SiO_{3/2})_c(SiO_{4/2})_d(XO_{1/2})_e$  Average unit formula (I):

(in the formula (I), $R^1$ may be the same or different and are optionally halogen-substituted monovalent hydrocarbons, where at least two $R^1$ in one molecule are alkenyl groups, and $0 \leq a < 1$, $0 \leq b < 1$, $0 \leq c < 0.9$, $0 < d < 1$, $0 \leq e < 0.4$, and $a+b+c+d=1.0$ is satisfied).

Examples of the optionally halogen-substituted monovalent hydrocarbon groups of $R^1$ in the above formula (I) include: C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C7-20 aralkyl groups such as benzyl, phenethyl, and phenylpropyl groups; C2-12 alkenyl groups such as vinyl, allyl, butenyl, pentenyl, hexenyl, heptenyl, octenyl, nonenyl, decenyl, undecenyl, and dodecenyl groups; and any of these groups in which some or all of the hydrogen atoms are substituted with halogen atoms such as fluorine, chlorine, and bromine atoms. $R^1$ may also be a hydroxyl group or an alkoxy group such as a methoxy group or an ethoxy group, in a small quantity within a range that does not hinder the objectives of the present invention. $R^1$ is preferably selected from among C1-6 alkyl groups, particularly a methyl group, or C2-6 alkenyl groups, particularly a vinyl group.

In formula (I) above, X is a hydrogen atom or an alkyl group. Preferred examples of the alkyl group represented by X include C1-3 alkyl groups, specifically, methyl, ethyl, and propyl groups.

In formula (I) above, a is preferably in the range of $0.1 \leq a \leq 0.9$, more preferably in the range of $0.2 \leq a \leq 0.8$, even more preferably in the range of $0.3 \leq a \leq 0.7$. In formula (I) above, b is preferably in the range of $0 \leq b \leq 0.5$, more preferably in the range of $0 \leq b \leq 0.3$, and particularly in the range of $0 \leq b \leq 0.1$. In formula (I) above, c is preferably in the range of $0 \leq c < 0.5$, more preferably in the range of $0 \leq c \leq 0.3$, and particularly in the range of $0 \leq c \leq 0.1$. In formula (I) above, d is preferably in the range of $0.1 \leq d \leq 0.9$, more preferably in the range of $0.2 \leq d \leq 0.8$, and particularly in the range of $0.3 \leq d \leq 0.7$. In formula (I) above, e is preferably in the range of $0 \leq e \leq 0.15$, more preferably in the range of $0 \leq e \leq 0.1$, and particularly in the range of $0 \leq e \leq 0.05$.

In a preferred embodiment of the present invention, the resinous alkenyl group-containing organopolysiloxane of component (A) may or may not, and preferably does not, contain the siloxane unit (D unit) represented by $SiO_{2/2}$ in the formula (I) above. In addition, the resinous alkenyl group-containing organopolysiloxane of component (A) may or may not, and preferably does not, contain the siloxane unit (T unit) represented by $SiO_{3/2}$ in the formula (I) above.

In a preferred embodiment of the present invention, the resinous alkenyl group-containing organopolysiloxane of component (A) comprises only M units and Q units. That is to say, in a preferred embodiment of the present invention, the resinous alkenyl group-containing organopolysiloxane of component (A) may be an MQ resin. In this preferred embodiment, the resinous alkenyl group-containing organopolysiloxane of component (A) may therefore be represented by the following average unit formula (II).

$(R^2R^3_2SiO_{1/2})_s(R^3_3SiO_{1/2})_t(SiO_{4/2})_u$  Average unit formula (II):

In the formula, $R^2$ is an alkenyl group, $R^3$ is an optionally halogen-substituted monovalent hydrocarbon group other than an alkenyl group, and $0 < s < 1$, $0 \leq t < 1$, and $0 < u < 1$ are satisfied.

Examples of alkenyl groups in formula (II) include C2-12 alkenyl groups such as vinyl, allyl, butenyl, pentenyl, hexenyl, heptenyl, octenyl, nonenyl, decenyl, undecenyl, and dodecenyl groups; C2-6 alkenyl groups are preferred, and vinyl groups are particularly preferred.

Examples of optionally halogen-substituted monovalent hydrocarbon groups other than alkenyl groups in formula (II) include C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C7-20 aralkyl groups such as benzyl, phenethyl, and phenylpropyl groups; and any of these groups in which some or all of the hydrogen atoms are substituted with halogen atoms such as fluorine, chlorine, and bromine atoms.

In formula (II), s is preferably in the range of $0.02 \leq s \leq 0.5$, more preferably in the range of $0.05 \leq s \leq 0.4$, and even more preferably in the range of $0.07 \leq s \leq 0.2$. In formula (II) above, t is preferably in the range of $0.1 \leq t \leq 0.7$, more preferably in the range of $0.2 \leq t \leq 0.6$, and in particular in the range of $0.3 \leq t \leq 0.5$. In formula (II) above, u is preferably in the range of $0.1 \leq u \leq 0.9$, more preferably in the range of $0.2 \leq u \leq 0.8$, and in particular in the range of $0.3 \leq u \leq 0.7$.

The content of the alkenyl groups in all of the silicon atom-bonded organic groups of the resinous alkenyl group-containing organopolysiloxane of component (A) is not particularly limited, and for example, may be 1 mol % or more, preferably 3 mol % or more, more preferably 4 mol % or more of the total of the silicon atom-bonded organic groups, and 20 mol % or less, preferably 15 mol % or less, more preferably 10 mol % or less of the total of the silicon atom-bonded organic groups. It should be noted that in the present specification, the alkenyl group content in the organopolysiloxane components may be determined by means of analysis such as Fourier transform infrared spectrophotometry (FT-IR) or nuclear magnetic resonance (NMR), or by means of a titration method described below.

A method for determining the alkenyl group amount in the components by means of a titration method will be described. The alkenyl group content in the organopolysiloxane components can be accurately quantified by means of a titration method generally known as the Wijs method. The principle will be described below. Firstly, an alkenyl group in the organopolysiloxane starting material and iodine monochloride are subjected to an addition reaction as shown in formula (1). Next, according to the reaction shown in formula (2), an excess amount of iodine monochloride is reacted with potassium iodide, thereby freeing iodine. The freed iodine is subjected to titration with a sodium thiosulfate solution.

$CH_2=CH-+2ICl \rightarrow CH_2I-CHCl-+ICl$ (excess)   Formula (1):

$ICl+KI \rightarrow I_2+KCl$   Formula (2):

The alkenyl group amount in the component can be quantified from the difference between the amount of sodium thiosulfate required for titration and the titration amount of the blank solution prepared separately.

The organopolysiloxane of component (A) is preferably solid or semi-solid at 25° C. The number average molecular weight of the organopolysiloxane of component (A) is not particularly limited, but is preferably in the range of 500 to 10,000.

The component (A) is included in an amount of 20 mass % or more based on the total mass of the organopolysiloxane components included in the curable silicone composition of the present invention. The content of the component (A) is preferably 30 mass % or more, more preferably 40 mass % or more, even more preferably 45 mass % or more, and particularly preferably 50 mass % or more, based on the total mass of organopolysiloxane components included in the curable silicone composition of the present invention. Furthermore, the content of the component (A) is preferably 80 mass % or less, more preferably 70 mass % or less, even more preferably 65 mass % or less, and particularly preferably 60 mass % or less, based on the total mass of organopolysiloxane components included in the curable silicone composition of the present invention.

Other Alkenyl Group-Containing Organopolysiloxanes

The curable silicone composition according to the present invention can also include an alkenyl group-containing organopolysiloxane comprising at least two alkenyl groups per molecule, in addition to the abovementioned component (A) of the present invention. This other alkenyl group-containing organopolysiloxane is not particularly limited, but linear alkenyl group-containing organopolysiloxane may be cited, for example.

The curable silicone composition according to the present invention may comprise one type of linear alkenyl group-containing organopolysiloxane, or may comprise a combination of two or more types of linear alkenyl group-containing organopolysiloxane. The curable silicone composition of the present invention preferably includes two or more types of linear alkenyl group-containing organopolysiloxane.

In one embodiment of the present invention, the linear alkenyl group-containing organopolysiloxane component may be represented by average structural formula (III): $R^1_3SiO(R^1_2SiO)mSiR^1_3$ (in the formula, $R^1$ is the same as in formula (I), except that at least two $R^1$ per molecule are alkenyl groups, and m is an integer of 5 to 1000).

In a further embodiment of the present invention, the linear alkenyl group-containing organopolysiloxane of formula (III) is preferably a linear organopolysiloxane capped at both ends of the molecular chain with alkenyl groups, and specifically, may be represented by the following average structural formula (IV)

  Formula (IV):

(in the formula, $R^2$ and $R^3$ are the same as in formula (II), and m is an integer of 5 to 1000).

In formulas (III) and (IV), m is 5 or more, preferably 50 or more, more preferably 100 or more, and even more preferably 150 or more. In formulas (III) and (IV), m is 2000 or less, preferably 1500 or less, more preferably 1200 or less, and even more preferably 1000 or less.

The content of the linear alkenyl group-containing organopolysiloxane is not particularly limited, but is preferably 5 mass % or more, more preferably 10 mass % or more, even more preferably 20 mass % or more, and more preferably 30 mass % or more, based on the total mass of all of the organopolysiloxane components included in the curable silicone composition of the present invention. In addition, the content of the linear alkenyl group-containing organopolysiloxane is preferably 99 mass % or less, more preferably 80 mass % or less, even more preferably 60 mass % or less, and particularly preferably 45 mass % or less, based on the total mass of all of the organopolysiloxane components.

In one embodiment of the present invention, the curable silicone composition of the present includes two or more types of linear alkenyl group-containing organopolysiloxane. In this case, the curable silicone composition of the present invention may include two or more types of linear alkenyl group-containing organopolysiloxanes having different molecular chain lengths. More specifically, the curable silicone composition of the present invention may include: a linear alkenyl group-containing organopolysiloxane (a1) in which, in abovementioned formulas (III) and (IV), m is 5-40, preferably 50-350, and more preferably 100-300; and a linear alkenyl group-containing organopolysiloxane (a2) in which, in abovementioned formulas (III) and (IV), m is 400-2000, preferably 500-1500, and more preferably 600-1000.

In one embodiment of the present invention, the curable silicone composition of the present invention may include the linear alkenyl group-containing organopolysiloxane (a1) in an amount of 5 mass % or more, preferably 10 mass % or more, more preferably 15 mass % or more, and even more preferably 20 mass % or more, based on the total mass of all of the organopolysiloxane components, and may include the linear alkenyl group-containing organopolysiloxane (a1) in an amount of 90 mass % or less, more preferably 70 mass % or less, even more preferably 50 mass % or less, and particularly preferably 35 mass % or less, based on the total mass of all of the organopolysiloxane components.

In one embodiment of the present invention, the curable silicone composition of the present invention may include the linear alkenyl group-containing organopolysiloxane (a2) in an amount of 1 mass % or more, preferably 3 mass % or more, more preferably 5 mass % or more, and even more preferably 7 mass % or more, based on the total mass of all of the organopolysiloxane components, and may include the linear alkenyl group-containing organopolysiloxane (a2) in an amount of 60 mass % or less, more preferably 40 mass % or less, even more preferably 30 mass % or less, and particularly preferably 20 mass % or less, based on the total mass of all of the organopolysiloxane components.

(B) Organohydrogenpolysiloxane Having at Least Two Silicon Atom-Bonded Hydrogen Atoms Per Molecule The component (B) is an organohydrogenpolysiloxane which acts as a crosslinking agent for a curable silicone composition by way of a hydrosilylation curing reaction, and has at least two silicon atom-bonded hydrogen atoms per molecule. The curable silicone composition according to the present invention may comprise one type of organohydrogenpolysiloxane (B), or may comprise a combination of two or more types of organohydrogenpolysiloxane (B).

Examples of the molecular structure of the component (B) are linear, linear with some branching, branched, resinous, cyclic, and 3D network structures. The component (B) may be one organohydrogenpolysiloxane having such a molecular structure, or a mixture of two or more such organohydrogenpolysiloxanes. The curable silicone composition of the present invention preferably comprises a linear organohydrogenpolysiloxane as the component (B).

The silicon atom-bonded hydrogen atoms of the organohydrogenpolysiloxane of the component (B) may include silicon atom-bonded hydrogen atoms at the molecular terminals or on side chains other than the molecular terminals. Examples of silicon atom-bonded groups other than silicon atom-bonded hydrogen atoms included in the component (B) include halogen-substituted or unsubstituted monovalent hydrocarbon groups other than alkenyl groups, for example, C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C7-20 aralkyl groups such as benzyl, phenethyl, and phenylpropyl groups; and any of these groups in which some or all of the hydrogen atoms are substituted with halogen atoms such as fluorine, chlorine, and bromine atoms. It should be noted that the silicon atoms in the component (B) may have a small quantity of hydroxyl groups or an alkoxy group such as a methoxy group or ethoxy group within a range that does not hinder the objectives of the present invention. Silicon atom-bonded groups other than silicon atom-bonded hydrogen atoms in the component (B) are preferably selected from among C1-6 alkyl groups, particularly methyl groups, and C6-20 aryl groups, particularly phenyl groups.

Examples of the component (B) include dimethylpolysiloxane capped at both ends of the molecular chain with dimethylhydrogensiloxy groups, dimethylsiloxane-methylphenylsiloxane copolymer capped at both ends of the molecular chain with dimethylhydrogensiloxy groups, dimethylsiloxane-methylhydrogensiloxane copolymer capped at both ends of the molecular chain with dimethylhydrogensiloxy groups, methylhydrogenpolysiloxane capped at both ends of the molecular chain with trimethylsiloxy groups, dimethylsiloxane-methylhydrogensiloxane copolymer capped at both ends of the molecular chain with trimethylsiloxy groups, organopolysiloxanes comprising $H(CH_3)_2SiO_{1/2}$ unit and $SiO_{4/2}$ unit, and organopolysiloxanes comprising $H(CH_3)_2SiO_{1/2}$ unit, $(CH_3)_3SiO_{1/2}$ unit, and $SiO_{4/2}$ unit.

In one embodiment, the organohydrogenpolysiloxane of the component (B) is linear and includes a silicon atom-bonded hydrogen atom on a side chain of the molecular chain. The organohydrogenpolysiloxane of the component (B) is preferably represented by the following average structural formula (V).

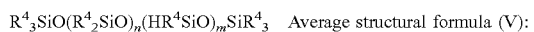
$R^4_3SiO(R^4_2SiO)_n(HR^4SiO)_mSiR^4_3$   Average structural formula (V):

In formula (V), $R^4$ are each independently an optionally halogen-substituted monovalent hydrocarbon group other than an alkenyl group, and $0 \leq n \leq 200$, $1 \leq m \leq 200$, and $1 \leq n+m \leq 300$ are satisfied.

Examples of optionally halogen-substituted monovalent hydrocarbon groups other than alkenyl groups of $R^4$ in formula (V) include: C1-12 alkyl groups such as methyl, ethyl, propyl, isopropyl, butyl, isobutyl, tert-butyl, pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C7-20 aralkyl groups such as benzyl, phenethyl, and phenylpropyl groups; and any of these groups in which some or all of the hydrogen atoms are substituted with halogen atoms such as fluorine, chlorine, and bromine atoms. $R^4$ is preferably a C1-12 alkyl group, particularly a methyl group.

In formula (V) above, n is preferably 150 or less, more preferably 100 or less, even more preferably 50 or less, and particularly preferably 30 or less.

In formula (V) above, m is preferably 2 or more, more preferably 5 or more, even more preferably 10 or more, preferentially 20 or more, and particularly preferably 30 or more. Furthermore, in formula (V) above, m is preferably 150 or less, more preferably 100 or less, even more preferably 85 or less, and particularly preferably 70 or less.

In formula (V) above, m+n is preferably 2 or more, more preferably 5 or more, even more preferably 10 or more, preferentially 20 or more, and particularly preferably 30 or more. Furthermore, in formula (V) above, m+n is preferably 150 or less, more preferably 100 or less, even more preferably 85 or less, and particularly preferably 70 or less.

The amount of the organohydrogenpolysiloxane of the component (B) is not particularly limited, but it is preferably contained in an amount exceeding 1 mass %, more preferably 2 mass % or more, even more preferably 3 mass % or more, and particularly preferably 5 mass % or more, based on the total mass of all of the organopolysiloxane components included in the curable silicone composition according to the present invention. Furthermore, the organopolysiloxane of the component (B) is preferably contained in an amount of 30 mass % or less, more preferably 20 mass % or less, even more preferably 16 mass % or less, and particularly preferably 12 mass % or less, based on the total mass of all of the organopolysiloxane components.

Furthermore, in another embodiment, the amount of organohydrogenpolysiloxane of the component (B) in the curable silicone composition according to the present invention may preferably be an amount resulting in 0.8 to 3.0 mols, more preferably an amount resulting in 0.9 to 2.5 mols, even more preferably an amount resulting in 0.95 to 2.2 mols, and particularly an amount resulting in 1.0 to 2.0 mols of silicon atom-bonded hydrogen atoms, with respect to 1 mol of silicon atom-bonded alkenyl groups in the alkenyl group-containing organopolysiloxane component as a whole. That is to say, the molar ratio (H/Vi) of the alkenyl groups and hydrogen atoms derived from the organopolysiloxane components of the curable silicone composition according to the present invention may preferably be 0.8 to 3.0, more preferably 0.9 to 2.5, even more preferably 0.95 to 2.2, and particularly 1.0 to 2.0.

(C) Alkyne Group-Containing Compound

The component (C) is an alkyne group-containing compound which is a hydrosilylation reaction inhibitor used for the purpose of adjusting the crosslinking rate or usable working time of the curable silicone resin of the present invention. The curable silicone composition according to the present invention may comprise one type of alkyne group-containing compound (C), or two or more types of alkyne group-containing compounds (C).

The component (C) is not particularly limited provided that it is a compound containing an alkyne group, and examples thereof include alkyne alcohols such as 3-methyl-1-butyn-3-ol, 3,5-dimethyl-1-hexyn-3-ol, and 3-phenyl-1-butyn-3-ol; and alkyne group-containing silanes such as methyl-tris(1,1-dimethyl-2-butynoxy)silane, methyl-tris(3-methyl-1-butyn-3-oxy)silane, and vinyl-tris(1,1-dimethyl-2-butynoxy)silane.

The molecular weight of the component (C) is not particularly limited, but is normally 50 or more, preferably 100 or more, more preferably 150 or more, and is furthermore normally 1000 or less, preferably 750 or less, more preferably 500 or less, or 400 or less.

The content of the component (C) is not particularly limited, but is 0.001 parts by mass or more, preferably 0.01 parts by mass or more, and more preferably 0.015 parts by mass, and furthermore, normally 1 part by mass or less, preferably 0.5 parts by mass or less, and even more preferably 0.1 parts by mass or less, with respect to 100 parts by mass of the organopolysiloxane components contained in the curable silicone composition of the present invention.

(D) Curing Catalyst

The component (D) curing catalyst is a hydrosilylation reaction curing component, and is a catalyst for promoting curing of the curable silicone composition of the present invention. Examples of the component (D) are platinum-based catalysts such as chloroplatinic acid, alcohol solutions of chloroplatinic acid, platinum-olefin complexes, platinum-1,3-divinyl-1,1,3,3-tetramethyldisiloxane complexes, and platinum-supporting powder; palladium-based catalysts such as tetrakis(triphenylphosphine)palladium, and mixtures of triphenylphosphine and palladium black; and rhodium-based catalysts, and platinum-based catalysts are particularly preferable.

The blend amount of component (D) is a catalytic amount, and more specifically, when a platinum-based catalyst is used as the component (D), the platinum atom amount may preferably be 0.01 ppm or more, more preferably 0.1 ppm or more, and even more preferably 1 ppm or more with respect to the total mass of the curable silicone composition of the present invention, and the platinum atom amount may preferably be 20 ppm or less, more preferably 15 ppm or less, even more preferably 10 ppm or less, and particularly preferably 5 ppm or less with respect to the total mass of the curable silicone composition of the present invention.

Optional components may be blended into the curable silicone composition of the present invention within a range that does not hinder the objectives of the present invention. Examples of the optional components include an acetylene compound, an organophosphorus compound, a vinyl group-containing siloxane compound, inorganic fillers such as crushed quartz, silica, titanium oxide, magnesium carbonate, zinc oxide, iron oxide and diatomaceous earth, inorganic fillers obtained by subjecting the surface of said inorganic fillers to hydrophobic treatment with an organosilicon compound, hydrosilylation reaction inhibitors other than the component (C), organopolysiloxanes free from a silicon atom-bonded hydrogen atom and a silicon atom-bonded alkenyl group, tack imparting agents, heat resistance imparting agents, cold resistance imparting agents, heat conductive fillers, flame retardants, thixotropy imparting agents, phosphors, solvents, and the like.

The thermally curable silicone composition of the present invention may include a silicone compound functionalized with an epoxy group or an alkoxy group, as an adhesion promoter which is an optional component. The silicone compound functionalized with an epoxy group or an alkoxy group is not particularly limited, but examples thereof include: an organosilane or a linear, branched, or cyclic organosiloxane oligomer of about 4 to 20 silicon atoms, having a trialkoxysiloxy group (for example, trimethoxysiloxy group or triethoxysiloxy group) or trialkoxysilylalkyl group (for example, trimethoxysilylethyl group or triethoxysilylethyl group) and a hydrosilyl or alkenyl group (for example, vinyl group or allyl group); an organosilane or a linear, branched, or cyclic organosiloxane oligomer of about 4 to 20 silicon atoms, having a trialkoxysiloxy group or trialkoxysilylalkyl group and a methacryloxyalkyl group (for example, 3-methacryloxypropyl group); an organosilane or a linear, branched, or cyclic organosiloxane oligomer of about 4 to 20 silicon atoms, having a trialkoxysiloxy group or trialkoxysilylalkyl group and an epoxy group-bonded alkyl group (for example, 3-glycidoxypropyl group, 4-glycidoxybutyl group, 2-(3,4-epoxycyclohexyl)ethyl group, or 3-(3,4-epoxycyclohexyl)propyl group); an aminoalkyltrialkoxysilane and epoxy group-bonded alkyltrialkoxysilane reaction product; and an epoxy group-containing ethyl polysilicate. Specific examples include vinyltrimethoxysilane, allyltrimethoxysilane, allyltriethoxysilane, hydrogentriethoxysilane, 3-glycidoxypropyltrimethoxysilane, 3-glycidoxypropyltriethoxysilane, 2-(3,4-epoxycyclohexyl)ethyltrimethoxysilane, 3-methacryloxypropyltrimethoxysilane, 3-methacryloxypropyltriethoxysilane, diethoxymethyl(3-(oxiranylmethoxy)propyl)silane, a reaction product of 3-glycidoxypropyltriethoxysilane and 3-aminopropyltriethoxysilane, a condensation reaction product of methylvinylsiloxane oligomer capped at both ends of the molecular chain with hydroxyl groups and 3-glycidoxypropyltrimethoxysilane, a condensation reaction product of methylvinylsiloxane oligomer capped at both ends of the molecular chain with hydroxyl groups and 3-methacryloxypropyltriethoxysilane, and tris(3-trimethoxysilylpropyl)isocyanurate. In the present composition, the content of the adhesion promoter is not limited, but is preferably in the range of 0.1 to 10 parts by mass, and more preferably in the range of 0.2 to 5 parts by mass, with respect to 100 parts by mass of the organopolysiloxane components of the curable silicone composition, for example.

The thermally curable silicone composition of the present invention may include a cerium-containing polysiloxane as a heat resistance imparting agent which is an optional component. A cerium-containing organopolysiloxane may be prepared, for example, by a reaction between cerium chloride or a cerium salt of a carboxylic acid and an alkali metal salt of a silanol group-containing organopolysiloxane. Thus, as used in the present specification, the term "cerium-containing organopolysiloxane" can mean a substance that is obtained by reacting a silanol group-containing organopolysiloxane and a cerium salt, where the silanol group of the organopolysiloxane and the cerium atom are chemically bonded. A cerium-containing polysiloxane may preferably be a cerium-containing dimethylpolysiloxane containing a dimethylsiloxane unit in the polysiloxane.

Examples of the cerium salt of a carboxylic acid include cerium 2-ethylhexanoate, cerium naphthenate, cerium oleate, cerium laurate, and cerium stearate. An example of a cerium chloride is cerium trichloride. Examples of alkali metal salts of silanol group-containing organopolysiloxanes include potassium salts of diorganopolysiloxanes capped at both ends of the molecular chain with silanol groups, sodium salts of diorganopolysiloxanes capped at both ends of the molecular chain with silanol groups, potassium salts of diorganopolysiloxanes capped at one end of the molecular chain with a silanol group and capped at the other end of the molecular chain with a triorganosiloxy group, and sodium salts of diorganopolysiloxanes capped at one end of the molecular chain with a silanol group and capped at the other end of the molecular chain with a triorganosiloxy group. Moreover, examples of silicon atom-bonded groups in these organopolysiloxanes include C1-12 alkyl groups such as methyl, ethyl, propyl, isopropyl, n-butyl, isobutyl, tert-butyl, n-pentyl, neopentyl, hexyl, cyclohexyl, heptyl, octyl, nonyl, decyl, undecyl, and dodecyl groups; C6-20 aryl groups such as phenyl, tolyl, xylyl, and naphthyl groups; C7-20 aralkyl groups such as benzyl, phenethyl, and phenylpropyl groups; and any of these groups in which some or all of the hydrogen atoms are substituted with halogen atoms such as fluorine, chlorine, or bromine atoms.

The content of the cerium-containing polysiloxane in the curable silicone composition of the present invention is not particularly limited, and it may be 2 parts by mass or less, preferably 1.5 parts by mass or less, even more preferably 1 part by mass or less, and furthermore 0.001 parts by mass or more, with respect to 100 parts by mass of the organopolysiloxane components of the curable silicone composition.

The viscosity of the curable silicone composition according to the present invention is not particularly limited, but is preferably in the range of 100 mPa·s to 50,000 mPa·s at 25° C., and more preferably in the range of 300 mPa·s to 10,000 mPa·s at 25° C. The viscosity may be measured by means of a B-type rotational viscometer (digital viscometer DV-II+ Pro, produced by Brookfield) in accordance with the method described in JIS K 7117-1:1999.

The curable silicone composition of the present invention has excellent storage stability at room temperature and a long pot life. For example, the curable silicone composition of the present invention has a pot life of 9 months or more, preferably 1 year or more, under conditions of 25° C./50% RH. Furthermore, the curable silicone composition of the invention is thermally curable, and can be cured at 100° C. or greater, and preferably in a temperature range of 130° C.-180° C., in a heating time of 60 minutes or less, preferably 30 minutes or less, and more preferably 15 minutes or less.

The curable silicone composition of the present invention may be prepared by mixing the components. The method of mixing the components may be a conventionally known method and is not particularly limited, and a uniform mixture is usually obtained by simple mixing. When a solid component such as an inorganic filler is included as an optional component, it is preferable to use a mixing device for the mixing. There are no particular limitations regarding this mixing device, and examples include single- and twin-screw continuous mixers, double roller mixers, Ross mixers, Hobart mixers, dental mixers, planetary mixers, kneader mixers, Henschel mixers, and the like.

Encapsulant

The present invention also relates to an encapsulant for semiconductor use, which comprises the curable silicone composition of the present invention. The encapsulant of the present invention cures to form a sealing material for an optical semiconductor element. The shape of the encapsulant in application thereof is not particularly limited, but it is preferably a dome shape or a sheet shape. The semiconductor to be sealed with the encapsulant or film of the present invention is not particularly limited, and examples include semiconductors of SiC, GaN, etc., and particularly optical semiconductors such as power semiconductors and light-emitting diodes.

Optical Semiconductor Element

The present invention also relates to an optical semiconductor element that is equipped with the encapsulant of the present invention. The optical semiconductor element may be, for example, a light-emitting diode (LED), a semiconductor laser, a photodiode, a phototransistor, or a light-emitting body or light-receiving body for a photocoupler or for solid-state imaging; it is particularly preferably a light-emitting diode (LED).

Light-emitting diodes (LEDs) produce emitted light from the upper, lower, left and right sides of the optical semiconductor element, so it is undesirable for components of the light-emitting diode (LED) to absorb light, and materials having high light transmittance or high reflectance are preferred for such components. Consequently, a substrate on which the optical semiconductor element is mounted also preferably comprises a material having high light transmittance or high reflectance. Examples of the substrate on which the optical semiconductor element is mounted include: conductive metals such as silver, gold and copper; non-conductive metals such as aluminum and nickel; thermoplastic resins mixed with white pigments, such as PPA and LCP; thermosetting resins containing white pigments, such as epoxy resins, BT resins, polyimide resins and silicone resins; and ceramics such as alumina and alumina nitride.

EXAMPLES

The curable silicone composition of the present invention will be described in greater detail by means of the following examples and comparative examples.

Curable silicone compositions were prepared by mixing the components in the formulation (parts by mass) shown in the table. It should be noted that Me represents a methyl group and Vi represents a vinyl group below. In addition, the structure of the organopolysiloxane components is shown in a simplified manner in the table, and the functional groups other than Me in the M or D unit are shown in parentheses. In addition, H/Vi indicates the molar ratio of the silicon atom-bonded hydrogen atom (H) and the vinyl group (Vi) in the organopolysiloxane components.

Component A: Alkenyl Group-Containing Organopolysiloxane

Component a-1: resinous alkenyl group-containing organopolysiloxane represented by average unit formula $(ViMe_2SiO_{1/2})_{10}(Me_3SiO_{1/2})_{40}(SiO_{4/2})_{50}$ Component a-2: resinous alkenyl group-containing organopolysiloxane represented by average unit formula $(ViMe_2SiO_{1/2})_{11}(Me_3SiO_{1/2})_{34}(SiO_{4/2})_{55}$ Component a-3: linear alkenyl group-containing organopolysiloxane represented by average structural formula $ViMe_2SiO(Me_2SiO)_{200}SiMe_2Vi$ Component a-4: linear alkenyl group-containing organopolysiloxane represented by average structural formula $ViMe_2SiO(Me_2SiO)_{805}SiMe_2Vi$ Component B: Organohydrogenpolysiloxane Component b: Linear organohydrogenpolysiloxane represented by average structural formula $Me_3SiO(HMeSiO)_{50}SiMe_3$ Component C: Alkyne Group-Containing Compound Component c: Methyl-tris(3-methyl-1-butyn-3-oxy)silane Component c': 1-ethynyl-1-cyclohexanol Component D: Curing Catalyst Component d: Complex of platinum and 1,3-divinyl-1,1,3,3-tetramethyldisiloxane having a platinum concentration of 4.0 mass %

Component e: Condensation reaction product of methylvinylsiloxane oligomer capped at both ends of the molecular chain with hydroxyl groups and 3-glycidoxypropyltrimethoxysilane Component f: Cerium-containing dimethylpolysiloxane

EXAMPLES AND COMPARATIVE EXAMPLES

Curable silicone compositions were prepared by mixing the components in the formulation (parts by mass) shown in the table below. Furthermore, the following evaluations were carried out and the results are summarized in the table below. It should be noted that the amount of the component d curing catalyst is shown in terms of the amount (ppm) of platinum atoms.

Pot Life

The curable silicone compositions prepared were introduced into a 20 mL glass flask and stored under conditions of 25° C./50% RH. The flowability of the compositions was visually confirmed, and the number of days for which the flowability could be maintained was determined as the pot life. Furthermore, the compositions having flowability were heated for 10 minutes at 150° C. to confirm that thermal curing properties were present.

TABLE 1

| Component | Example 1 | Example 2 | Comparative Example 1 | Comparative Example 2 |
|---|---|---|---|---|
| a-1 $MVi_{10}M_{40}Q_{50}$ | 53.2 | 55.7 | — | — |
| a-2 $MVi_{11}M_{34}Q_{55}$ | — | — | 33.4 | 10.3 |
| a-3 $MViD_{200}MVi$ | 27.7 | 28.9 | 49.4 | 29.4 |
| a-4 $MViD_{850}MVi$ | 10.1 | 10.6 | 10.1 | 58.1 |
| b $MD^H_{50}M$ | 9.0 | 4.8 | 7.1 | 2.2 |
| Total of a and b components | 100 | 100 | 100 | 100 |
| c | 0.02 | 0.02 | — | 0.02 |
| c' | — | — | 0.05 | 0.01 |
| d | 3.3 ppm | 3.5 ppm | 3.4 ppm | 8.0 ppm |
| e | 0.5 | 0.5 | 0.5 | 0.5 |
| f | 0.5 | 0.5 | 0.5 | 0.3 |
| H/Vi | 2.0 | 1.0 | 2.0 | 1.4 |
| Evaluation | | | | |
| Pot life (Days) | 600 | 600 | 208 | 102 |

The test results of the abovementioned examples and comparative examples showed that the curable silicone composition according to the present invention demonstrated a pot life of 600 days at room temperature while maintaining curability by means of heating at 150° C. for 10 minutes. The silicone composition according to the present invention therefore has extremely good storage stability at room temperature while still maintaining thermal curing properties.

INDUSTRIAL APPLICABILITY

The curable silicone composition of the present invention has excellent pot life at room temperature. Accordingly, the present invention can provide a one-component type curable silicone composition with excellent storage stability.

What is claimed is:

1. A curable silicone composition comprising:
(A) a resinous alkenyl group-containing organopolysiloxane including at least two alkenyl groups per molecule and at least one siloxane unit represented by $SiO_{4/2}$ wherein the component (A) is represented by the following average unit formula(I);

$$(R^1_3SiO_{1/2})_a(R^1_2SiO_{2/2})_b(R^1SiO_{3/2})_c(SiO_{4/2})_d(XO_{1/2})_e \quad (I)$$

wherein
$R^1$ may be the same or different and each is independently selected from the group consisting of C1-12 alkyl groups and C2-12 alkenyl groups, where at least two $R^1$ in one molecule are alkenyl groups, $0<a<1$, $0<b<1$, $0<c<0.9$, $0<d<1$, $0<e<0.4$, and $a+b+c+d=1.0$; and X is a hydrogen atom or an alkyl group;
(B) an organohydrogenpolysiloxane having at least two silicon atom-bonded hydrogen atoms in one molecule wherein the organohydrogenpolysiloxane is a linear organohydrogenpolysiloxane having silicon atom-bonded hydrogen atoms on a side chain;
(C) an alkyne group-containing compound that is an alkyne group-containing silane selected from the group consisting of methyl-tris(1,1-dimethyl-2-butynoxy)silane, methyl-tris(3-methyl-1-butyn-3-oxy)silane, vinyl-tris (1,1-dimethyl-2-butynoxy)silane, and combinations thereof; and
(D) a curing catalyst, wherein the content of the resinous alkenyl group-containing organopolysiloxane (A) is 20 mass % or more based on the total mass of the organopolysiloxanes.

2. The curable silicone composition as claimed in claim 1, further including a linear alkenyl group-containing organopolysiloxane.

3. The curable silicone composition as claimed in claim 1, including at least two linear alkenyl group-containing organopolysiloxanes.

4. The curable silicone composition as claimed in claim 1, wherein the curing catalyst (D) is a platinum-based catalyst and includes from 0.01 ppm to 10 ppm of platinum atoms with respect to the total mass of the curable silicone composition.

5. The curable silicone composition as claimed in claim 4, wherein the molar ratio (H/Vi) of the alkenyl groups and hydrogen atoms derived from the organopolysiloxanes is from 0.8 to 3.0.

6. An encapsulant comprising the curable silicone composition as claimed in claim 1.

7. An optical semiconductor device that is equipped with a cured product of the encapsulant as claimed in claim 6.

8. The curable silicone composition as claimed in claim 1, that is free of 1-ethynyl-1-cyclohexanol.

9. The curable silicone composition as claimed in claim 8, wherein the (A) resinous alkenyl group-containing organopolysiloxane is represented by average unit formula:

$$(ViMe_2SiO_{1/2})_{10}(Me_3SiO_{1/2})_{40}(SiO_{4/2})_{50}.$$

10. The curable silicone composition as claimed in claim 9, further including
a first linear alkenyl group-containing organopolysiloxane represented by average structural formula:

$$ViMe_2SiO(Me_2SiO)_{200}SiMe_2Vi;$$

and
a second linear alkenyl group-containing organopolysiloxane represented by average structural formula:

$$ViMe_2SiO(Me_2SiO)_{850}SiMe_2Vi.$$

11. The curable silicone composition as claimed in claim 10, wherein the (B) organohydrogenpolysiloxane is a linear organohydrogenpolysiloxane represented by average structural formula:

$$Me_3SiO(HMeSiO)_{50}SiMe_3.$$

12. The curable silicone composition as claimed in claim 11, wherein the (C) alkyne group-containing compound is methyl-tris(3-methyl-1-butyn-3-oxy)silane and is present in an amount of from about 0.015 to about 0.1 parts by weight based on 100 parts by weight of the organopolysiloxane components.

13. The curable silicone composition as claimed in claim 12 having a pot life of at least about 600 days measured under conditions of 25° C./50% RH.

14. The curable silicone composition as claimed in claim 1,
wherein the (A) resinous alkenyl group-containing organopolysiloxane is represented by average unit formula:

(ViMe$_2$SiO$_{1/2}$)$_{10}$(Me$_3$SiO$_{1/2}$)$_{40}$(SiO$_{4/2}$)$_{50}$ and is present in an amount of from about 53 to about 56 weight precent based on a total weight of (A) and (B); and
that is free of 1-ethynyl-1-cyclohexanol.

15. The curable silicone composition as claimed in claim 14, further including
a first linear alkenyl group-containing organopolysiloxane represented by average structural formula:

ViMe$_2$SiO(Me$_2$SiO)$_{200}$SiMe$_2$Vi present in an amount of from about 28 to about 29 weight precent based on a total weight of (A) and (B); and
a second linear alkenyl group-containing organopolysiloxane represented by average structural formula:

ViMe$_2$SiO(Me$_2$SiO)$_{850}$SiMe$_2$Vi present in an amount of from about 10 to about 11 weight precent based on a total weight of (A) and (B).

16. The curable silicone composition as claimed in claim 15,
wherein the (B) organohydrogenpolysiloxane is a linear organohydrogenpolysiloxane represented by average structural formula:

Me$_3$SiO(HMeSiO)$_{50}$SiMe$_3$ present in an amount of from about 5 to about 9 weight precent based on a total weight of (A) and (B);
wherein the (C) alkyne group-containing compound is methyl-tris(3-methyl-1-butyn-3-oxy)silane and is present in an amount of from about 0.015 to about 0.1 parts by weight based on 100 parts by weight of the organopolysiloxane components; and
wherein the composition has a pot life of at least about 600 days measured under conditions of 25° C./50% RH.

17. The curable silicone composition as claimed in claim 1, that is free of 1-ethynyl-1-cyclohexanol and wherein the (C) alkyne group-containing compound is methyl-tris(3-methyl-1-butyn-3-oxy)silane and is present in an amount of from about 0.015 to about 0.1 parts by weight based on 100 parts by weight of the organopolysiloxane components.

18. A curable silicone composition comprising:
(A) a resinous alkenyl group-containing organopolysiloxane represented by average unit formula:

(ViMe$_2$SiO$_{1/2}$)$_{10}$(Me$_3$SiO$_{1/2}$)$_{40}$(SiO$_{4/2}$)$_{50}$;

a first linear alkenyl group-containing organopolysiloxane represented by average structural formula:

ViMe$_2$SiO(Me$_2$SiO)$_{200}$SiMe$_2$Vi;

and
a second linear alkenyl group-containing organopolysiloxane represented by average structural formula:

ViMe$_2$SiO(Me$_2$SiO)$_{850}$SiMe$_2$Vi;

(B) a linear organohydrogenpolysiloxane represented by average structural formula:

Me$_3$SiO(HMeSiO)$_{50}$SiMe$_3$;

(C) an alkyne group-containing compound that is methyl-tris(3-methyl-1-butyn-3-oxy)silane present in an amount of from about 0.015 to about 0.1 parts by weight based on 100 parts by weight of the organopolysiloxane components; and
(D) a curing catalyst, wherein the content of the resinous alkenyl group-containing organopolysiloxane (A) is 20 mass % or more based on the total mass of the organopolysiloxanes;
wherein the composition is free of 1-ethynyl-1-cyclohexanol;
wherein the composition has a pot life of at least about 600 days measured under conditions of 25° C./50% RH; and
wherein the molar ratio (H/Vi) of the alkenyl groups and hydrogen atoms derived from the organopolysiloxanes is from about 1 to about 2.

* * * * *